Figure 1:
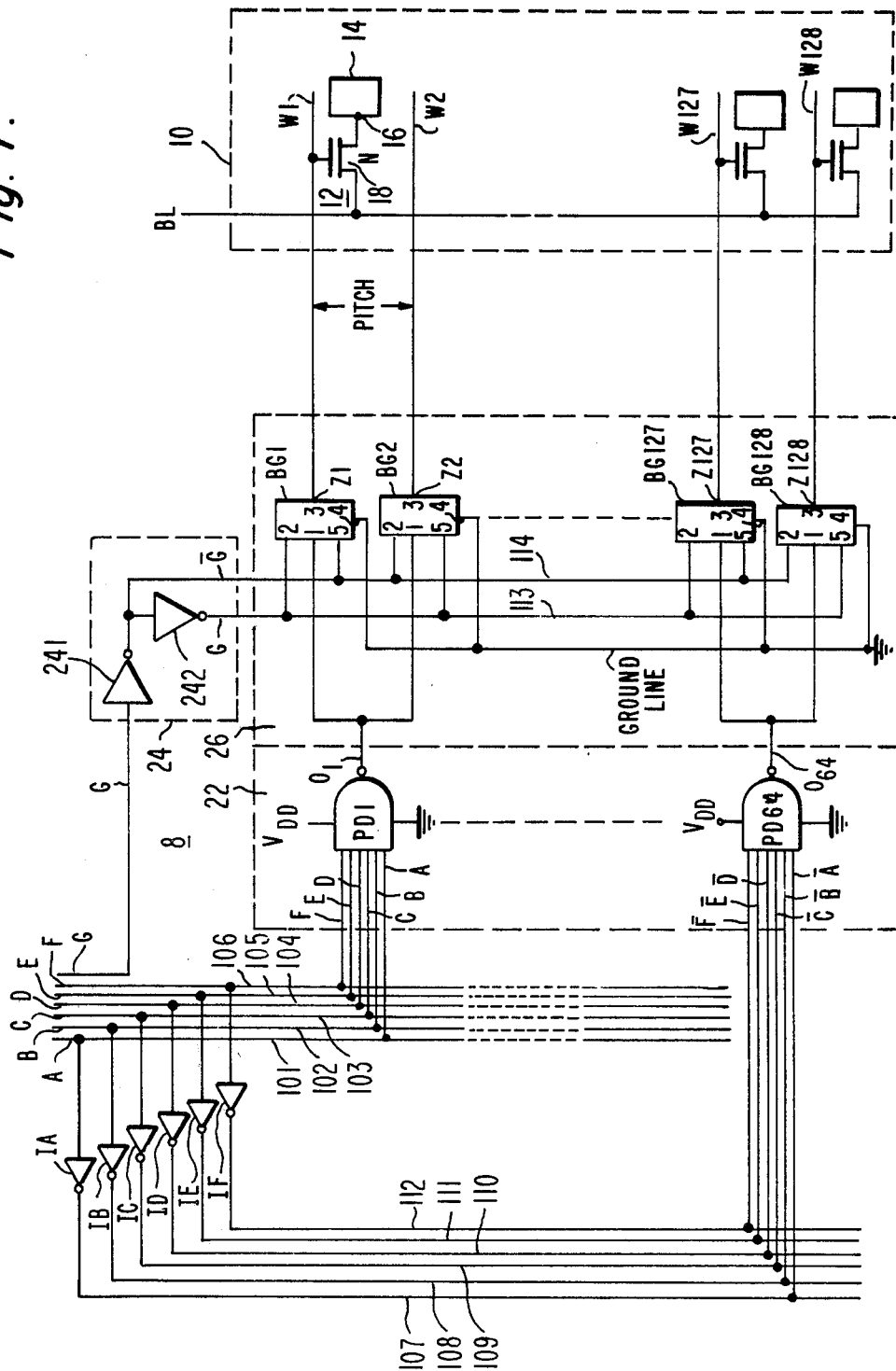

United States Patent [19]

Stewart

[11] 4,344,005
[45] Aug. 10, 1982

[54] POWER GATED DECODING

[75] Inventor: Roger G. Stewart, Neshanic Station, N.J.

[73] Assignee: RCA Corporation, New York, N.Y.

[21] Appl. No.: 44,363

[22] Filed: Jun. 1, 1979

[30] Foreign Application Priority Data

Jul. 18, 1978 [GB] United Kingdom ............... 30169/78

[51] Int. Cl.³ ................. H03K 19/177; H03K 19/094; H03K 19/21; G11C 7/00
[52] U.S. Cl. .................................... 307/463; 307/449; 307/471; 365/230
[58] Field of Search ................. 307/205, 270, DIG. 5, 307/216, 463, 449, 471; 365/230, 231

[56] References Cited

U.S. PATENT DOCUMENTS

| | | | |
|---|---|---|---|
| 3,761,899 | 9/1973 | McKenny | 307/DIG. 5 X |
| 3,778,784 | 12/1973 | Karp et al. | 307/DIG. 5 X |
| 3,906,461 | 9/1975 | Cappon | 307/DIG. 5 X |
| 3,980,899 | 9/1976 | Shimada et al. | 307/DIG. 5 X |
| 3,986,042 | 10/1976 | Padgett et al. | 307/205 |
| 4,194,130 | 3/1980 | Moench | 307/DIG. 5 X |
| 4,216,390 | 8/1980 | Stewart | 307/270 X |

Primary Examiner—Larry N. Anagnos
Attorney, Agent, or Firm—Samuel Cohen; Henry I. Schanzer

[57] ABSTRACT

A decoder in which the decoding of N input variables to produce $2^N$ unique outputs is carried out in steps, and in which some of the signals to be decoded also function to power part of the decoding circuitry. First, X of the N variables are decoded separately, as a group, to produce $2^X$ unique outputs while the remaining N-X variables are also separately decoded, as a group, to produce $2^{(N-X)}$ unique outputs, where N and X are positive integers and X is less than N. Then, the outputs of the two groups are logically combined by means of $2^N$ decoding buffer gates to produce $2^N$ unique outputs. Each one of the $2^X$ unique outputs is applied to the signal input terminals of $2^{(N-X)}$ different ones of the $2^N$ buffer gates and each one of the $2^{(N-X)}$ unique outputs is used to power $2^X$ different ones of the $2^N$ buffer gates to produce $2^N$ unique outputs of the N input variables, at the outputs of the buffer gates.

13 Claims, 5 Drawing Figures

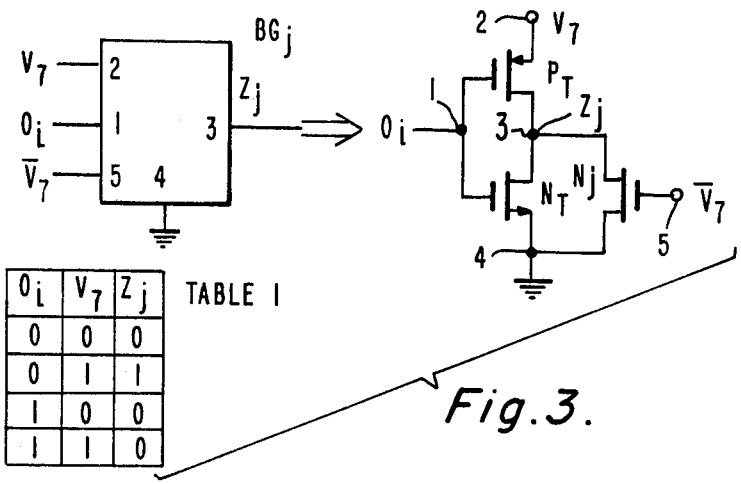
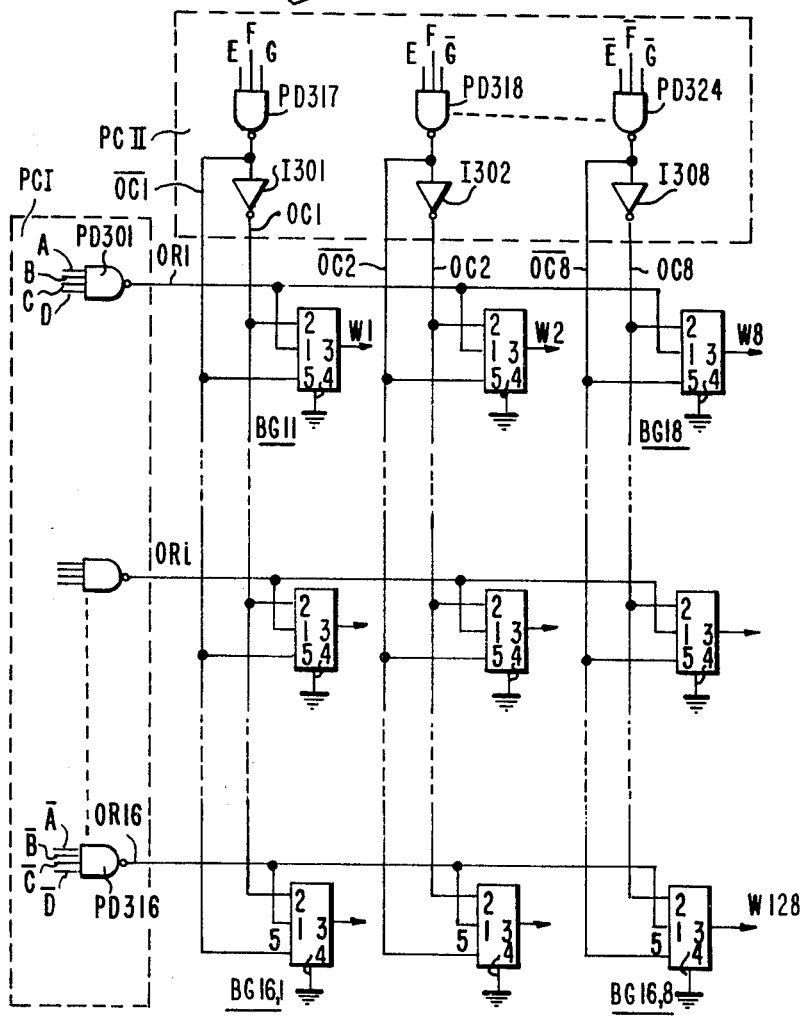
Fig.3.
Fig.4.

POWER GATED DECODING

This, invention relates to decoding circuitry, and in particular, to decoding circuitry in which some of the signals to be decoded also function to power part of the decoding circuitry.

Combining a power and a signal line enables the design of a a very compact decoder which is, for example, highly suited for use with high density memory arrays.

At the present time, a significant effort in the design of semiconductor memories is directed toward increasing their density and thereby their capacity. As the memory cells are being made smaller, designers of memory arrays are being limited in many instances by the size of the decoders. This is particularly so in the design of static memories employing static decoders comprised of complementary-metal-oxide-semiconductor (CMOS) transistors. For example, a conventional CMOS decoder for energizing any one of 128 row (word) lines of a memory array, in response to all possible combinations of seven memory address signals (and their complements), could be formed using 128 7-input CMOS NAND (or NOR) gates, with each 7-input gate comprising 14 transistors (7 in series and 7 in parallel). Also, to properly drive their associated word lines these NAND gates have to be buffered which, in CMOS, means at least two additional transistors per gate. Thus, well over 2,000 transistors are required for the 128 gates. The large number (i.e. 14, or 16 if buffering is included) of transistors required to decode each combination makes it impossible to place the decoder gate corresponding to each row of the memory on "pitch" (i.e. in line) with the row. "Pitch" as used herein refers to the distance between two rows or word lines of the memory array. The conventional decoder described requires too many components to permit the lay-out of each decoder gate corresponding to a row of the memory on pitch with that row. Also, the large total number of transistors requires much chip area, and presents serious lay-out and yield problems.

Alternatively, the decoder could take a form known as a matrix decoder described, for example, at pages 98-101 of *Electronic Digital Techniques* by Paul M. Kintner, published 1968 by McGraw-Hill, Inc. In matrix decoding, the procedure is to carry out the decoding in two or more steps. In the first step the signals to be decoded are divided into groups and are separately decoded. The outputs of the various groups are then combined for final decoding. Such a decoder requires considerably fewer transistors than the conventional approach discussed above. However, a full matrix decoder requires many conductor lines to be routed through the final decoding circuitry. These lines run, generally, in a direction perpendicular to that of the word lines and, if too numerous, interfere with the compact lay-out of the decoder circuitry. Hence, much of the chip area saved by the reduction in the number of components is lost by the additional conductor lines required.

A decoder is needed which can fit on "pitch" with the rows (words) or columns of a memory array, and which will neither require many components nor too much chip area.

In circuits embodying the invention, X (e.g. 4) variables, of N (e.g. 7) variables to be decoded, are decoded separately as a first group to produce Q outputs while the remaining (N−X) variables are decoded as a second group to produce P outputs, where Q and P are, respectively, equal to a maximum of $2^X$ and $2^{(N-X)}$. The Q and P outputs are applied to R decoding buffer gates arrayed in Q rows and P columns to produce R unique outputs, where R is equal to a maximum of the product of P and Q. Each buffer gate has a signal input terminal, a power terminal, and an output terminal at which is produced an output signal which is a logic function of the signals applied to its input and power terminals. The signal input terminals of the buffer gates of a row are connected to a corresponding one of the Q outputs and the power terminals of the buffer gates of a column are connected to a corresponding one of the P outputs. The buffer gates are compact, can be located adjacent to the cells of the memory array, and can fit on "pitch" with the rows (or columns) of memory arrays or other high density circuitry with which they are to cooperate.

Figure 5:
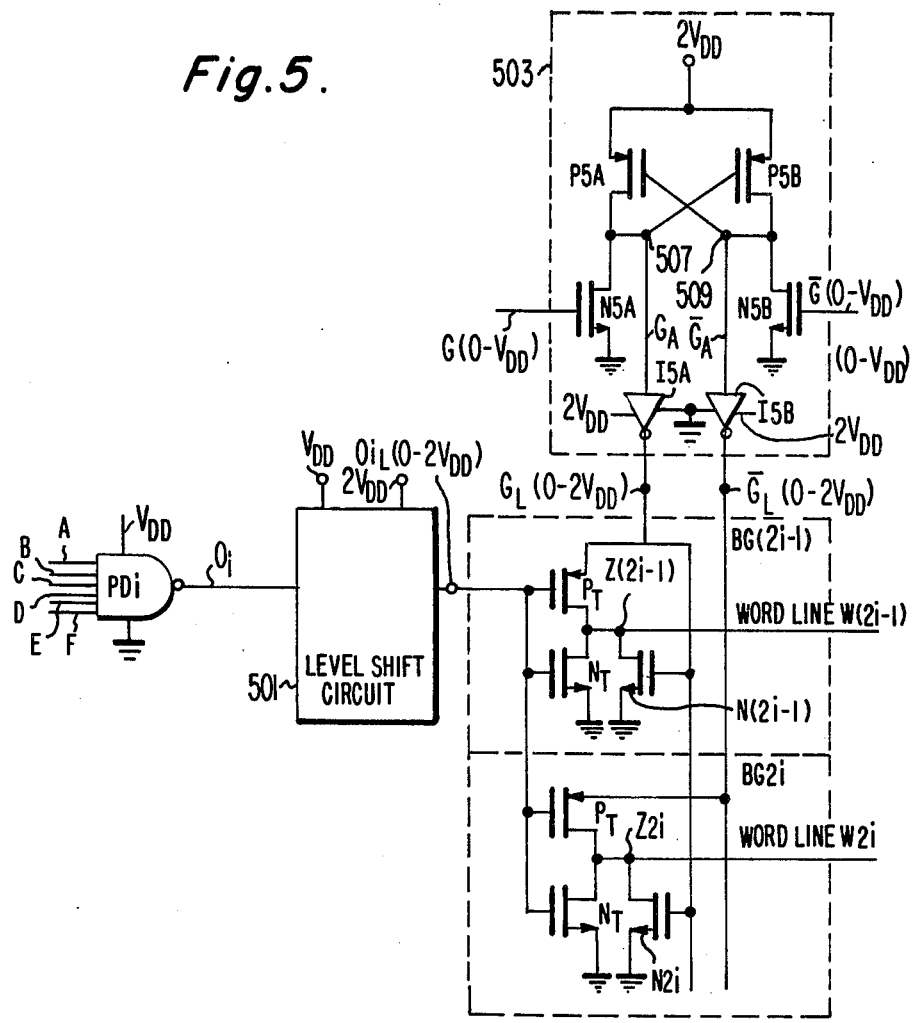
Figure 2:
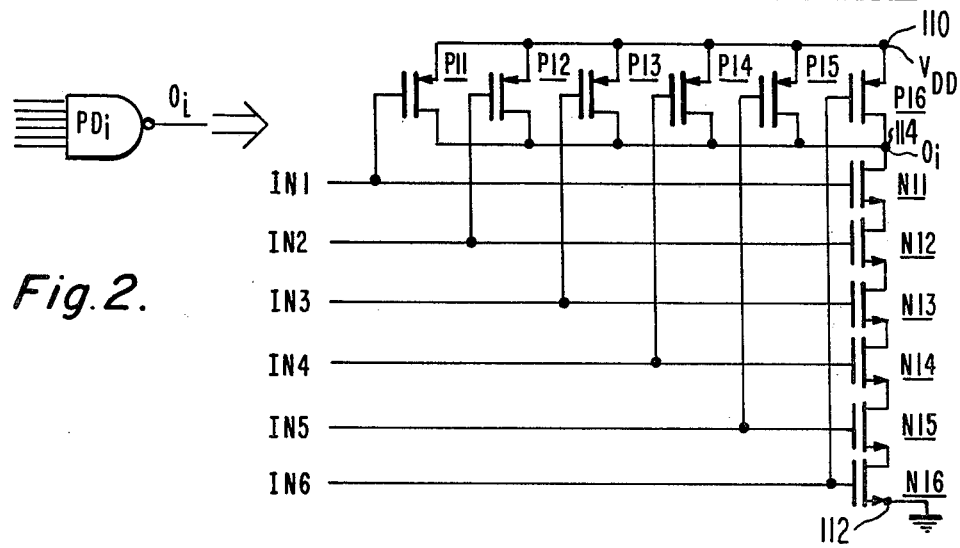

In the accompanying drawing like reference characteristics denote like components; and FIG. 1 is a partial schematic, partial block diagram of a decoder embodying the invention in combination with a known memory array;

FIG. 2 is a detailed schematic diagram of a known logic gate which may be used in the circuit of FIG. 1;

FIG. 3 includes a detailed schematic diagram of a decoding buffer gate used in the circuit of FIG. 1;

FIG. 4 is a partial schematic, partial block; diagram of a matrix decoder embodying the invention; and FIG. 5 is another diagram of a circuit embodying the invention.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definitions and characteristics of IGFETs pertinent to the invention are set forth in column 2 of U.S. Pat. Nos. 4,037,114 and 4,001,606 and are incorporated herein by reference.

Seven input variables (A, B, C, D, E, F, G) which represent memory address control signals generated by external circuitry (not shown) are applied to the circuit of FIG. 1. The seven input variables are divided into two groups; the first group consists of six (A, B, C, D, E, F) variables and the second group consists of the remaining variable (G). The six variables comprising the first group are inverted via inverters IA, IB, IC, ID, IE, and IF, to produce their complements $\overline{A}$, $\overline{B}$, $\overline{C}$, $\overline{D}$, $\overline{E}$, and $\overline{F}$. The inverters shown in FIG. 1 are preferably of the type employing IGFETs of complementary conductivity type. However, other suitable inverters could be used instead. Twelve signal lines (101 through 112), which carry the six variables and their complements are routed along one side of the decoder 8, (the signal lines extending in a perpendicular direction relative to the word lines of a memory array 10).

Decoder 8 includes: (1) a first predecoder section 22 in which the first group of variables (A, B, C, D, E, F,)

is decoded separately; (2) a second predecoder section 24 in which the second group of variables is also decoded separately. For the instance of just one variable (G), the decoding reduces to the simple case of just producing the signal (G) and its complement ($\overline{G}$). Thus, the seventh input variable (G) is buffered via cascaded inverters 241 and 242, and $\overline{G}$, the complement of G, is produced at the output of inverter 241; and (3) a final decoding section 26 comprised of 128 buffer gates in which the outputs of sections 22 and 24 are combined to produce 128 (i.e. $2^7$) unique outputs of the 7-input variables.

Predecoder section 22 includes sixty-four 6-input CMOS NAND gates (PD1 ... PD64) as shown in FIG. 2. Each NAND gate has 6-input terminals (IN1 ... IN6), one positive power terminal 110 to which is applied $+V_{DD}$ volts, one negative power terminal 112 to which is applied ground potential, and an output terminal 114 at which is produced an output Oi, where $1 \leq i \leq 64$. Each NAND gate includes 6 transistors of P-conductivity type having their conduction paths connected in parallel between terminals 110 and 114 and 6 transistors of N-conductivity type having their conduction paths connected in series between terminals 114 and 112. Each one of the P-type transistors is paired with a different one of the N-type transistors and the gate electrodes of each pair are connected in common to a different one of the input terminals.

The operation of the circuit of FIG. 2 is known and need not be detailed. Suffice it to say that when all the inputs to the NAND gate are "high" (at, or close to $V_{DD}$) the output (Oi) is "low" (at, or close to zero volts). When any one or more of the inputs to the NAND gate are "low" the output Oi is "high".

In the discussion to follow, a potential at, or near, ground is arbitrarily defined as a logic "0" or "low" condition, and any potential at or near $+V_{DD}$ volts is arbitrarily defined as logic "1" or "high" condition. Although the CMOS NAND gate has many advantages, other types of logic gates performing the same logic function could be used instead.

Referring back to FIG. 1, the 64 (i.e. $2^6$) possible combinations of leads carrying the six input variables (A, B, C, D, E, F) and their complements ($\overline{A}$, $\overline{B}$, $\overline{C}$, $\overline{D}$, $\overline{E}$, $\overline{F}$,) are respectively connected to the inputs of the 64 predecoder gates (PD1 through PD64). Each gate produces an output [$O_1$–$O_{64}$] representing the NAND logic function of the 6 input variables it receives, as discussed in connection with FIG. 2. Each predecoded output ($O_i$) is applied to the signal input terminals of two decoding buffer gates [BG(2i−1), BG2i].

Each decoding buffer gate BGj, (where $1 \leq j \leq 128$), as detailed in FIG. 3, includes: (1) a P-type IGFET ($P_T$) whose conduction path is connected between a power terminal 2 and an output terminal 3 at which is produced a signal Zj; (2) an N-type IGFET ($N_T$) whose conduction path is connected between output terminal 3 and a ground terminal 4; (3) means connecting the gate electrodes of $P_T$ and $N_T$ in common to a signal input terminal 1, to which is applied the output (Oi) of one of the predecoder gates; (4) a clamping transistor (Nj) of N-conductivity type whose conduction path is connected in parallel with $N_T$ between the output terminal 3 and ground and whose gate electrode is connected to a terminal 5; and (5) means applying a signal, denoted for ease of description as $V_7$, to terminal 2 and means applying $\overline{V_7}$, to terminal 5.

The operation of, and function performed by, the buffer gate is best explained by reference to FIG. 3 and the accompanying Table 1.

When the signal, $V_7$, applied to terminal 2 is "high" the signal $\overline{V_7}$ applied to the gate of transistor Nj is "low" and transistor Nj is turned off. $P_T$ and $N_T$ then function as a complementary inverter. When Oi is high (with $V_7$ high), $P_T$ is turned-off; $N_T$ is then turned-on, clamping output terminal 3 to ground and Zj is low. When Oi is low (with $V_7$ high), $N_T$ is turned-off; $P_T$ is turned-on and the "high" at terminal 2 is coupled via the conduction path of $P_T$ to terminal 3 causing Zj to be high. Logically, Zj is equal to the "ANDing" of the complement ($\overline{Oi}$) of the signal (Oi) applied to terminal 1 and the signal $V_7$ at terminal 2. Zj may thus be expressed as Zj=$\overline{Oi}\cdot V_7$. When $V_7$ is "low", $\overline{V_7}$ "high" is applied to the gate of Nj. Nj is then turned-on, conducts in the common source mode, and clamps terminal 3 to ground. Thus, as set forth in Table 1, Zj is "high" only for the condition when Oi is low and when $V_7$ is high. For all the other conditions, Zj is low; it is clamped to ground.

Nj is needed to clamp the buffer output (Zj) to ground when Oi and $V_7$ are both "low" even though Zj would be relatively low for this signal condition in the absence of Nj. When $V_7$ and Oi are "low" $P_T$ is turned-on. But, it conducts in the source follower mode, and although it tends to discharge terminal 3 via its conduction path to the ground at terminal 2, $P_T$ ceases to conduct when the potential at terminal 3 reaches its threshold voltage ($V_T$). Thus, for $V_7$ and Oi "low", $P_T$ cannot discharge terminal 3 below $V_T$. But, transistor Nj does positively clamp the buffer gate output terminal to ground because it is turned on by the high signal $\overline{V_7}$ and it conducts in the common source mode.

Referring back to FIG. 1, the seventh variable, G, produced at the output of inverter 242 is applied via line 113 to terminal 2 of the odd numbered buffer gates, [BG(2i−1)], and to terminal 5 of the even numbered gates, BG2i, while $\overline{G}$ is applied via line 114 to terminal 2 of the even numbered buffer gates (BG2i) and to terminal 5 of the odd numbered buffer gates. The gate electrode of the clamping transistor (Nj) of each buffer gate is thus driven by a signal (e.g. $\overline{G}$) which is the complement of the signal (e.g. G) applied to the buffer gate power terminal 2. So driven, as discussed above, the clamping transistor ensures the positive clamping to ground of a non-selected output (e.g. Z2 and its corresponding word line, W2) sharing the same predecoded output (e.g. O1) as a selected output (e.g. Z1 and its corresponding word line, W1). The outputs of the odd numbered buffer gates may be expressed as Z(2i−1)=$\overline{Oi}\cdot G$, while the outputs of the even numbered buffer gates may be expressed as Z(2i)=$\overline{Oi}\cdot\overline{G}$.

Each output (Zj) of the decoder is connected to a word line (Wj) of memory array 10 bearing a like postscript or subscript.

Memory array 10 is a random access memory (RAM) array of cells 12 having 128 rows (words).

Each cell 12 includes a storage element 14 having an input/output, (I/O), point 16 and a gating transistor, 18, whose conduction path is connected between the I/O point 16 and a bit line, BL. The gate electrodes of the gating transistors of a row are connected to the word line associated with that row. Assume the gating transistors 18 to be of N-conductivity type. Then, a word line is selected (i.e. its associated gating transistors are turned-on) when the voltage applied to it is "high" or logic "1"; and a word line is unselected (i.e. its associated gating transistors are turned-off) when the voltage applied to it is "low" or logic "0". The decoder 8 selects (energizes) a word line corresponding to a particular combination of the input variables.

The operation of the decoder will now be discussed for one, typical, signal condition.

Assume that $A=B=C=D=E=F="1"=V_{DD}$. Since 01 is equal to $\overline{A \cdot B \cdot C \cdot D \cdot E \cdot F}$, 01 is "low", while 02 through 064 are "high". Assume also that G is "high" hence $\overline{G}$ is "low". Therefore, BG1 has a "high" applied to its terminal 2, and a "low" applied to its terminals 1 and 5. Thus, N1 and $N_T$ of BG1 are turned off, while $P_T$ of BG1 is turned on causing Z1 to go high. Recall that $Z1=\overline{Oi} \cdot G$, since 01 is equal to $\overline{A \cdot B \cdot C \cdot D \cdot E \cdot F}$, Z1 is equal to $A \cdot B \cdot C \cdot D \cdot E \cdot F \cdot G$=high while all other outputs (Z2 ... Z128) are low. The high at Z1 is applied to word line W1 and the first word or row of memory 10 is selected for a read or a write operation depending on circuitry (not shown) coupled to the bit lines.

By powering BG2 with $\overline{G}$ (the complement of the signal powering BG1) and applying G1 to the gate of N2, the Z2 output of BG2 (and the output of all other even numbered buffer gates) is clamped to ground and W2 remains unselected even though the same 01 is applied to BG1 (which is selected) and BG2 (which is not selected). Furthermore, when 01 is low, the remaining predecoded outputs 02 through 064 are high. Hence, the $N_T$ transistors in BG3 through BG128 are turned on and clamp their outputs (Z3 through Z128) to ground.

It should be evident that for a different condition of the seven input variables one, and only one, other output and word line will be energized.

At this juncture it is of interest to specifically point out some of the features of the circuit embodying the invention.

Each buffer gate (BGj) consists of only 3 transistors and can be easily placed on pitch with, and adjacent to, each row of the memory array 10 especially since no cross-coupling is required between input and output. The predecoder gates PD1 through PD64 and the buffer inverters 241, 242 can be located somewhat more remotely from the memory array. Since there are 2 word lines per predecoder gate, each predecoder gate can be made as wide as 2 rows of the memory 10 (i.e. have a "2-pitch" width). Hence, the lay-out of the predecoder gates is not a serious problem. Also, each predecoder gate output is applied to very high impedance point (the gate electrodes of transistors $P_T$ and $N_T$). Therefore, the predecoder gate outputs (Oi) need not be buffered.

Another feature of the invention is that, the outputs (Zj) of the buffer gates BGj need not be buffered. When the output of the buffer gate is "low", it (and its associated word line) is clamped to ground via transistor Nj and/or transistor $N_T$. Thus, each output Zj is coupled to ground via the relatively low impedance of one transistor or via the still lower impedance of two transistors connected in parallel. When the output of a buffer gate is "high", it (and its associated word line) is coupled to the G or $\overline{G}$ line via the conduction path of a transistor $P_T$. Inverting buffers 241 and 242 generate G and $\overline{G}$. Since only one of these inverters is needed for each one of the G and $\overline{G}$ signal lines, these inverters may be formed using large size (very low impedance) transistors without significant loss in area. Making the transistors forming inverters 241 and 242 significantly larger than the $P_T$ transistors and since only one $P_T$ transistor is conducting a "high" at any one time, the conducting $P_T$ transistor can easily couple the full $V_{DD}$ to the output of its buffer gate. Therefore, when enabled by G and $\overline{G}$, the buffer formed by $P_T$ and $N_T$ is very nearly as fast as a conventional inverter where the source of $P_T$ would be connected directly to $V_{DD}$.

Still another feature of the invention is that the use of the seventh variable (G) and its complement ($\overline{G}$) to power the decoding buffer gates eliminates the need to run a $V_{DD}$ line to the buffer gates. Note that the G and $\overline{G}$ signal lines have to be routed through the buffer gate section for combination with the predecoded Oi outputs to produce the 128 possible combinations of the 7 input variables. Thus, the use of the G and $\overline{G}$ lines to control the clamping transistors to one group of buffers while powering the remaining buffers is obtained at substantially no cost since no extra line is required.

In the circuit of FIG. 1, some of the signal and conductor lines may be defined as "critical" since they affect the ability to minimize decoder area. The critical lines include: (a) the twelve conductor lines (101–112) needed to route the six input variables (A, B, C, D, E, F,) and their complements to the predecoder gates (PD1 ... PD64); (b) the $V_{DD}$ and ground lines for the predecoder gates; (c) the two conductor lines (113,114) needed to route the seventh input variable and its complement to the buffer gates; and (d) a ground line for the buffer gates. Thus, there is a total of 17 critical lines.

The significance of the features of the invention are best appreciated by comparing the circuit of FIG. 1 to a conventional static matrix decoder decoding 7 input variables in the same order (6 and 1) as in FIG. 1. The conventional matrix decoder could be expected to have predecoding sections corresponding, and similar, to sections 22 and 24 of FIG. 1. However, in contrast to Applicant's invention, the buffer gate decoding section of the matrix decoder would include 128 2-input NAND (or NOR) gates. Each NAND gate would, in CMOS, include 4 transistors (two in series, and two in parallel) and, thus, require at least 128 more transistors than the circuit of FIG. 1. Furthermore, the outputs of the NAND gates would, normally, have to be buffered since, for one signal condition, two of the NAND gate transistors would have their conduction paths connected in series between the NAND gate output and one of the power lines. Thus, the circuit of FIG. 1 requires significantly fewer transistors.

In addition, the conventional matrix decoder requires more critical lines than the circuit of FIG. 1. The conventional matrix decoder needs an additional $V_{DD}$ line to distribute power to the 2-input NAND gates and additional $V_{DD}$ and ground lines for the buffers associated with the NAND gates. Thus, the circuit of FIG. 1 requires fewer conductors and fewer transistors than a conventional matrix decoder.

The circuit of FIG. 1 uses approximately one half the number of transistors needed to make conventional 7-bit decoder formed of 128 7-input CMOS NAND gates. Even more interesting is that the conventional 7-bit decoder typically requires fewer conductor lines than other approaches. However, the circuit of FIG. 1 requires even fewer critical lines than the conventional 7-bit scheme. The conventional decoder circuit formed using 128 7 input NAND gates would need: (a) 14 conductor lines to route the 7 input variables and their complements to the NAND gates; (b) 2 conductors to route $V_{DD}$ and ground to the NAND gates; and (c) 2 conductors to route $V_{DD}$ and ground to the gates needed to buffer the outputs of the 7 input NAND gates. Thus, 18 "critical" lines would be required versus 17 for the circuit of FIG. 1.

The decoder of FIG. 1 may be modified as shown in FIG. 4 to produce a full matrix decoder. The seven input variables are separated into two groups. The first group includes 4 (A, B, C, D) of the seven variables and the second group includes the remaining 3 variables (E, F, G).

The first group of variables is predecoded by means of a first predecoder (PC1) comprised of sixteen 4-input NAND gates (PD301 . . . PD316) to produce 16 unique row outputs (OR1 . . . OR16) of the 4 variables. The remaining 3 variables are predecoded by means of a second predecoder (PCII) comprised of eight 3-input NAND gates (PD317 . . . PD324) to produce 8 unique control outputs ($\overline{OC1}$ . . . $\overline{OC8}$) which are applied to inverters I301 through I308 to produce 8 additional powering outputs denoted OC1 through OC8. Thus, associated with each column is a power signal (OC1 . . . OC8) and a control signal ($\overline{OC1}$ . . . $\overline{OC8}$) which is the complement of the power signal. Except for the smaller number of inputs, the 4 input and 3 input NAND gates are similar in function and structure to the gate described in FIG. 2 and need not be further detailed.

The outputs of the first and second groups of predecoding gates are applied to a matrix array of 128 decoding buffer gates, of the type shown in FIG. 3, arranged in 16 rows and 8 columns.

The input terminal 1 of the buffer gates of a row are connected in common to a corresponding output of one of the predecoding gates PD301 through PD316. The power terminal 2 of the buffer gates of each column are connected in common to a corresponding column power output OC1 . . . OC8 while the control terminal 5 of the buffer gates of each column are connected in common to their corresponding control signal output. The 128 buffer gates, as in the circuit of FIG. 1, function to combine logically the signals, OR1 through OR16, produced at the outputs of the predecoder PCI gates with the power signals, OC1 through OC8, produced by predecoder PCII to produce 128 unique outputs.

The full matrix decoder of FIG. 4 requires fewer transistors than the decoder arrangement of FIG. 1. PCI is comprised of sixteen 4 input gates for a total of 128 transistors (i.e. 16×8). PCII is comprised of eight 3-input gates plus 8 complementary inverters for a total 64 transistors (8×6+8×2); and the 128 buffer gates require 384 transistors (i.e. 3×128). Thus, a relatively small total number of transistors (560) is needed. As discussed above, each buffer gate can be made with just 3 transistors and the output of the buffer gates need not be buffered. Hence, the circuit of FIG. 4 would require at least 128 transistors less than a full matrix decoder employing 2-input NAND gates.

However, the full matrix decoder of FIG. 4 requires more conductor lines (of the type defined as critical) than the circuit of FIG. 1 since the complement of each column output (OC and $\overline{OC}$) has to be applied to the gate electrodes of the clamping transistors of the column. The "critical" conductor lines affect the ability to minimize the decoder area. In FIG. 4, 16 critical conductor lines are needed to route the 8 outputs of PCII and their complements to the buffer gates. In addition, 8 critical conductor lines are needed to route the four input variables and their complements to the PCI gates PD301 through PD316. However, where the operation of the memory array is such that the outputs of the buffer gates do not have to be positively clamped to ground (i.e. the word lines need not be discharged below $V_T$ volts), then each buffer gate needs only transistors $P_T$ and $N_T$ and only one powering output per column is needed. Then only 8 critical lines are needed to route the outputs of the 3-input gates (PCII) to the buffer gates and a total of 256 transistors (instead of 384) would be required to form the buffer gates.

The circuit of FIG. 1 may be modified as shown in FIG. 5 to include circuitry for level shifting the signals being decoded.

The output Oi of a predecoding gate PDi is applied to the input of a level shift circuit 501. For example, the level shift circuit may be of the type described in U.S. Pat. Nos. 4,039,862 or 4,080,539 or in my co-pending application Ser. No. 948,509 titled, "Level Shift Circuit", now U.S. Pat. No. 4,216,390, or may be any other suitable level shift circuit. The level shift circuit may be of the inverting or noninverting type. For ease of discussion it is assumed that the level shift circuit is noninverting, that it is powered by a positive operating potential of 2 $V_{DD}$ volts, that, in response to an input signal (Oi) of 0 volts, it produces an output of 0 volts and, that, in response to an Oi of $V_{DD}$ volts, it produces an output of 2 $V_{DD}$ volts.

The seventh variable (G) and its complement ($\overline{G}$) are applied to the input of a latching level shift circuit 503 which is also powered by 2 $V_{DD}$ volts. The structure and operation of the level shift circuit 503 is described in U.S. Pat. Nos. 3,801,831 or 4,039,862 and need not be detailed. The complementary signals (G and $\overline{G}$) are applied to the inputs of transistors N5A, N5B, to whose drains are connected cross-coupled load transistors P5A, P5B. Transistors N5A-P5A and N5B-P5B form two level shifting inverters at whose outputs 507, 509 are produced signals ($G_A$ and $\overline{G}_A$) which vary between ground and 2 $V_{DD}$ volts. $G_A$ and $\overline{G}_A$ are applied to inverters I5A and I5B, respectively, which are powered by an operating potential of 2 $V_{DD}$ volts. The outputs $G_L$ and $\overline{G}_L$ of inverters I5A and I5B are in phase with G and $\overline{G}$, respectively, but are at 0 and 2 $V_{DD}$ volts when the latter are at 0 and $V_{DD}$ volts, respectively.

The FIG. 5 circuit illustrates the advantage of using one of the signals to be decoded to also power the decoding buffer gates. In some circuits it is sometimes possible to share the $V_{DD}$ line of one portion of the circuit with another portion of the circuit. However, where, as in FIG. 5, different portions of the circuit are operated at different potentials, it is virtually impossible to use the power lines of one section to distribute power to another section.

Also, in FIG. 5 the $G_L$ and $\overline{G}_L$ lines bring 2 $V_{DD}$ to the decoding buffer gates which can then couple that signal to the word lines of the associated memory array.

The invention has been illustrated in conjunction with a memory array. But, the decoder of the invention may be used together with Programmable Logic Arrays (PLA's) and/or special purpose memories. These logic arrays and special memories may have N (e.g. 7) control or input signals, but need not require the full $2^N$ (e.g. 128) outputs. Thus, without departing from the invention, N input variables may be separated into two groups, one of X variables and the other of N−X variables. But, it is not always necessary to produce all of the $2^X$ outputs. Clearly, only "Q" outputs need be produced where Q is a maximum of $2^X$. Likewise, it is not always necessary to produce all of the $2^{(N-X)}$ outputs.

Only "P" outputs need be produced where P is a maximum of $2^{(N-X)}$. In a similar vein in many real systems it is not always necessary to decode all of the possible combinations of P and Q. Thus, only R outputs and R decoding buffer gates may be needed, where R is equal to a maximum of the product of P and Q.

The invention has been illustrated using two steps to fully decode the input variables. It should be appreciated that the decoding could be one in more than two steps. For example, 6 of the seven variables could be separated into two groups with the two groups being decoded in a matrix arrangement to produce 64 unique outputs. Then, the 64 outputs could be logically combined with the seventh variable as in FIG. 1. Also, consider 5,1,1 arrangement.

What is claimed is:

1. In a matrix decoder for decoding N variables wherein X of the N variables are decoded separately to produce Q outputs and the remaining N−X variables are decoded separately to produce P outputs, an improved buffer decoder stage for logically combining a selected one of the Q outputs with selected one of the P outputs comprising:
   a first insulated-gate field-effect transistor (IGFET) of first conductivity type, and second and third IGFETs of second conductivity type, each IGFET having a conduction path and a control electrode;
   means connecting the conduction path of said first IGFET between a first power terminal and an output terminal;
   means connecting the conduction paths of said second and third IGFETs in parallel between said output terminal and a second power terminal;
   means connecting the control electrodes of said first and second IGFETs to an input terminal;
   means for applying said selected Q output to said input terminal,
   means for applying said selected P output to said first power terminal;
   means for applying a reference potential to said second power terminal; and
   means for applying to the control electrode of said third IGFET the complement of the signal applied to said first power terminal.

2. The combination comprising:
   N input variables to be decoded, where N is a positive integer greater than 2;
   first partial decoding means responsive to X of the N input variables for producing Q unique outputs, where X is a positive integer less than N and Q is equal to a maximum of $2^X$;
   second partial decoding means responsive to the remaining N−X inputs for concurrently producing P unique outputs of said remaining N−X inputs, where P is equal to a maximum of $2^{N-X}$;
   R decoding buffer gates, where R is equal to a maximum of the product of P and Q, each buffer gate having a signal input terminal, first and second power terminals, and an output terminal, each one of said decoding buffer gates being of the type which when the signal at its input terminal is of one binary value and the potential at its first power terminal is of the other binary value produces a signal at its output terminal of said other binary value and which when the signal at its input has said other binary value produces a signal at its output of said one binary value; and
   means for producing R unique outputs at the output terminals of said R buffer gates including means for applying each one of said Q outputs to the signal input terminals of P different ones of said R buffer gates and means for applying each one of said P outputs to said first power terminal of Q different ones of said R buffer gates.

3. The combination as claimed in claim 2 further including means for applying a reference potential to said second power terminal of said one of said buffer gates having a value approximately equal to that of said one binary value.

4. The combination as claimed in claim 3 wherein each one of said buffer gates also has a control terminal and includes means for clamping the signal at its output terminal to the potential at said second power terminal when the signal at its control terminal is of said other binary value.

5. The combination as claimed in claim 4 wherein each one of said buffer gates includes a first IGFET of first conductivity type and second and third IGFETs of second conductivity type, each IGFET having a conduction path and a control electrode, wherein the conduction path of said first IGFET is connected between the first power terminal and the output terminal of the gate, wherein the conduction paths of said second and third IGFETs are connected in parallel between the output and second power terminals of the gate, wherein the gate electrodes of the first and second IGFETs are connected in common and define the input terminal of the gate, and wherein the gate electrode of said third IGFET is connected to said control terminal.

6. The combination as claimed in claim 5 wherein N−X is equal to 1.

7. The combination as claimed in claim 5 wherein said first partial decoding means includes means for inverting and decoding all but one of said N variables for producing said Q unique outputs, and
   wherein said second partial decoding means includes means for buffering and for inverting the remaining one of said N variables defined as G and for producing an output signal G and its complement $\overline{G}$.

8. The combination as claimed in claim 7 wherein the signal G is applied to the first power terminals of one half of said decoding buffer gates and to the control terminals of the other half of said decoding buffer gates; and
   wherein $\overline{G}$ is applied to the first power terminal of said other half of said decoding buffer gates and to the control terminals of said one half of said decoding buffer gates.

9. The combination as claimed in claim 2 wherein said first and second partial decoding means includes level shifting means.

10. The combination comprising:
    N input variables to be decoded, where N is an integer greater than 2;
    decoding means responsive to X of the N inputs variables for producing $2^X$ unique outputs of the X inputs, where X is an integer which is less than N;
    means responsive to the remaining N−X inputs for simultaneously producing up to 2N−X unique outputs of the remaining N−X inputs;
    $2^N$ decoding buffer gates each having a signal input terminal, a first power terminal, a second power terminal to which is applied a reference potential, and an output terminal; each one of said decoding buffer gates being of the type which when the signal at its input terminal is of one binary value and the potential at its first power terminal is of the other binary value produces a signal at its output terminal of said other binary value, and which when the signal at its input has said other binary value produces a signal at its output of said one binary value; and means for applying each one of the $2^X$ outputs to the signal input terminals of $2^{N-X}$ different buffer gates; and means for applying each one of the $2^{N-X}$ outputs to the first power terminals of $2^X$ different buffer gates.

11. The combination comprising:

first and second lines;

N circuits connected between said first and second lines, where N is an integer greater than 1, each of said N circuits having an input terminal and an output terminal, and each of said N circuits including:

a first insulated-gate field-effect transistor (IGFET) of first conductivity type, and second and third IGFETs of second conductivity type, each IGFET having a conduction path and a control electrode; means connecting the conduction path of said first IGFET between said first line and the output terminal of that circuit; means connecting the conduction paths of said second and third IGFETs in parallel between the output terminal of that circuit and said second line; and means connecting the control electrodes of said first and second IGFETs of each one of said circuits to the input terminal of that circuit;

means for applying a different first binary signal to each input terminal of said N circuits;

means for applying a second two-valued binary signal to said first line;

means for applying a reference potential to said second line; and means for applying to the control electrode of said third IGFET of each of said N circuits the complement of the signal applied to said first line.

12. The combination as claimed in claim 11 wherein said third IGFET of each one of said N circuits when conditioned to conduct clamps said output terminal to said second line via a relatively low impedance path exhibiting substantially zero voltage offset when zero current flows through it.

13. The combination comprising:

a first insulated-gate field-effect transistor (IGFET) of first conductivity type, and second and third IGFETs of second conductivity type, each IGFET having a conduction path and a control electrode;

means connecting the conduction path of said first IGFET between a first power terminal and an output terminal;

means connecting the conduction paths of said second and third IGFETs in parallel between said output terminal and a second power terminal;

means connecting the control electrodes of said first and second IGFETs to an input terminal;

means for applying a first two-valued binary signal to said input terminal;

means for applying a second two-valued binary signal to said first power terminal;

said first transistor conducting in the source follower mode for one condition of said first and second binary signals and in the common source mode for another condition of said first and second binary signals, said first transistor passing current in one direction when conducting in the source follower mode and in the opposite direction when conducting in the common source mode;

means for applying a reference potential to said second power terminal; and means for applying to the control electrode of said third IGFET the complement of the signal applied to said first power terminal, for causing said third transistor to conduct in the common source mode for the signal condition causing said first transistor to conduct in the source follower mode.

* * * * *

UNITED STATES PATENT AND TRADEMARK OFFICE
CERTIFICATE OF CORRECTION

PATENT NO. : 4,344,005

DATED : August 10, 1982

INVENTOR(S) : Roger Green Stewart

It is certified that error appears in the above-identified patent and that said Letters Patent is hereby corrected as shown below:

Col. 3, line 20 "$1 \leqq i \leqq 64$" should be --- $1 \leq i \leq 64$ ---.

line 53 "$1\leqq j\leqq 128)$" should be $1 \leq j \leq 128)$ --- line 68 "$V_7$" should be --- $\overline{V_7}$ ---.

Col. 4, line 5 "$V_7$" should be --- $\overline{V_7}$ ---.

line 14 "(Oi)" first occurrence should be --- $(\overline{Oi})$ ---.

line 16 "$Oi \cdot V_7$" first occurrence should be --- $\overline{Oi} \cdot V_7$ ---.

line 16 "$V_7$" third occurrence should be --- $\overline{V_7}$ ---.

Col. 5, line 62 "G" second occurrence should be --- $\overline{G}$ ---.

line 65 "G" second occurrence should be --- $\overline{G}$ ---.

Col. 6, line 5 "G" should be --- $\overline{G}$ ---.

Col. 9, line 21 "decoder" should be --- decoding ---.

Col. 10, line 62 "2N-X" should be --- $2^{N-X}$ ---.

Signed and Sealed this

Twenty-eighth Day of December 1982

[SEAL]

Attest:

GERALD J. MOSSINGHOFF

Attesting Officer

Commissioner of Patents and Trademarks